US006277763B1

(12) United States Patent
Kugimiya et al.

(10) Patent No.: US 6,277,763 B1
(45) Date of Patent: Aug. 21, 2001

(54) PLASMA PROCESSING OF TUNGSTEN USING A GAS MIXTURE COMPRISING A FLUORINATED GAS AND OXYGEN

(75) Inventors: Katsuhisa Kugimiya, Narita; Takanori Nishizawa; Daisuke Tajima, both of Chiba, all of (JP)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/465,031

(22) Filed: Dec. 16, 1999

(51) Int. Cl.$^7$ .................................................. H01L 21/00
(52) U.S. Cl. ...................... 438/720; 156/345; 216/59; 216/67; 216/75; 252/79.1; 438/9; 438/742; 438/740
(58) Field of Search ............................. 438/8, 9, 14, 710, 438/720, 727, 730, 740, 742; 156/345 P, 345 MT; 216/59, 60, 67, 75; 252/79.1

(56) References Cited

U.S. PATENT DOCUMENTS

| 4,713,141 | * | 12/1987 | Tsang ............................. 438/720 X |
| 4,838,990 | * | 6/1989 | Jucha et al. .................... 438/720 X |
| 5,571,366 | | 11/1996 | Ishii et al. ........................ 156/345 |

FOREIGN PATENT DOCUMENTS

| 0 489 407 A2 | 6/1992 | (EP) . |
| 09082686 | 3/1997 | (JP) . |

OTHER PUBLICATIONS

Ootera et al "Highly Selective Etching of W/WN/Poly–Si Gate on Thin Oxide Film with Gaspuff Plasmas" Proceedings of Symposium on Dry Process, pp. 155–160, Nov. 11–12, 1999.

Pan, et al. "Selective Reactive Ion Etching of Tungsten Films in $CHF_3$ and Other Fluorinated Gases", 8257b *Journal of Vacuum Science & Technology B*, No. 4, pp. 1073–1080, Jul./Aug. 1988.

Theisen, et al. "Maskless Tungsten Etch Process for Plug Fill", 1046b Extended Abstracts, Spring Meeting, pp. 248–249, May 6–11, 1990.

* cited by examiner

*Primary Examiner*—William Powell
(74) *Attorney, Agent, or Firm*—Thomason Moser Patterson

(57) ABSTRACT

A method and apparatus for etching of a substrate comprising both a polysilicon layer and an overlying tungsten layer. The method comprises etching the tungsten layer in a chamber using a plasma formed from a gas mixture comprising a fluorinated gas (such as $CF_4$, $NF_3$, $SF_6$, and the like) and oxygen.

29 Claims, 3 Drawing Sheets

PLASMA PROCESSING OF TUNGSTEN USING A GAS MIXTURE COMPRISING A FLUORINATED GAS AND OXYGEN

BACKGROUND OF THE DISCLOSURE

1. Field of Invention

The present invention relates generally to a method and apparatus for dry etching semiconductor wafers. More specifically, the invention relates to a method and apparatus for etching tungsten using a gas mixture comprising a fluorinated gas and oxygen.

2. Background of Prior Art

Integrated circuits have evolved into complex devices that can include millions of transistors, capacitors and resistors on a single chip. The evolution of chip designs continually requires faster circuitry and greater circuit density. Circuit density has a pronounce importance as the speed and number of functions a circuit can execute increases along with the density of the circuit structure. Some design attributes affecting the speed and circuit density of integrated circuits include the resistance and thickness of the materials used to form the layer comprising the circuit structure formed on a substrate.

A material frequently used to fabricate circuit structures is tungsten. Tungsten may be accurately deposited using conventional Chemical Vapor Deposition (CVD) methods and generally has a low resistivity. Circuit designers have found tungsten to be a favorable material for use proximate polysilicon as tungsten exhibits good resistance to permeation by polysilicon, which enables tungsten to retain its physical properties over the course of substrate processing and device use.

In order to maximize circuit density, the layers comprising the circuit structure, including those comprising tungsten, must be minimized. However, when processing such thin layers, care must be taken to avoid damaging the layers during processing. Damaged layers result in defective circuit structures and increased substrate rejects.

One process that can easily damage thin layers is etching. When etching tungsten, the fluorinated chemistry typically employed to remove exposed tungsten on the substrate also is an aggressive etchant of polysilicon. Typical etching systems employ endpoint detection systems that detect the presence of polysilicon in the chamber gases that signal the break through of the tungsten layer and etching of the underlying polysilicon layer. When polysilicon is detected in the exhaust gases, the etch is terminated. Optionally, a timed over-etch step is employed to "clean-up" and remove the residual tungsten that was not removed during the main etch step.

A problem encountered when etching tungsten having an underlying polysilicon layer is the difficulty in controlling the amount of polysilicon etched during the main and optional over-etch of the tungsten. Generally, fluorinated chemistries used for low rate etching, i.e., etch rates of tungsten less than of 2000 Å/min, have poor selectivity to polysilicon. As a result, once the tungsten has been etched to expose the underlying polysilicon layer, the polysilicon is removed at an undesired rate (often substantially equivalent to the etch rate of tungsten). This leads to an unwanted amount of polysilicon being removed before the endpoint can be detected and the etch terminated. For example, over-etching the tungsten layer results in the excessive etching of the underlying polysilicon layer. The resulting trench typically exhibits poor depth control and corner formation.

Although chemistries with higher selectivity are available for tungsten etching, those chemistries generally exhibit high etch rates, i.e., etch rates in excess of 2000 Å/min. Thus, even though polysilicon etches at a slower rate than tungsten, undesirable amounts of polysilicon can be removed prior to end point detection due to the high rate of etch. The result is difficulty in controlling the etch depth. Lack of control of the etch depth is highly undesirable when forming circuit structures from thin layers as the underlying layer may be etched through inadvertently.

Therefore, there is a need in the art for a tungsten etching process having good selectivity to polysilicon.

SUMMARY OF INVENTION

The disadvantages associated with the prior art are overcome by the present invention of a method and apparatus for etching of a substrate comprising both a polysilicon layer and an overlying tungsten layer. The method and apparatus etches the tungsten layer using a plasma formed from a gas mixture comprising a fluorinated gas (for example, $CF_4$, $NF_3$, $SF_6$, and other gases comprising fluorine) and oxygen. The oxygen reacts with the polysilicon that is exposed by the break through of the tungsten layer. The surface oxide, or etch stop layer, that is formed by the oxygen/polysilicon reaction protects the polysilicon from the etchant, thus providing for good selectivity between the polysilicon and tungsten.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

An embodiment of the present invention is a method of etching a substrate comprising a tungsten layer overlying polysilicon. The embodiment of the present invention etches the tungsten to expose the polysilicon material while minimizing the amount of polysilicon removed, i.e., the etch process exhibits good selectivity between tungsten and polysilicon. The etch process of the present invention can be reduced to practice in a number of etching systems capable of plasma processing tungsten. One such system is a Decoupled Plasma Source (DPS) Centura etch system available from Applied Materials, Inc., of Santa Clara, Calif.

Figure 1:
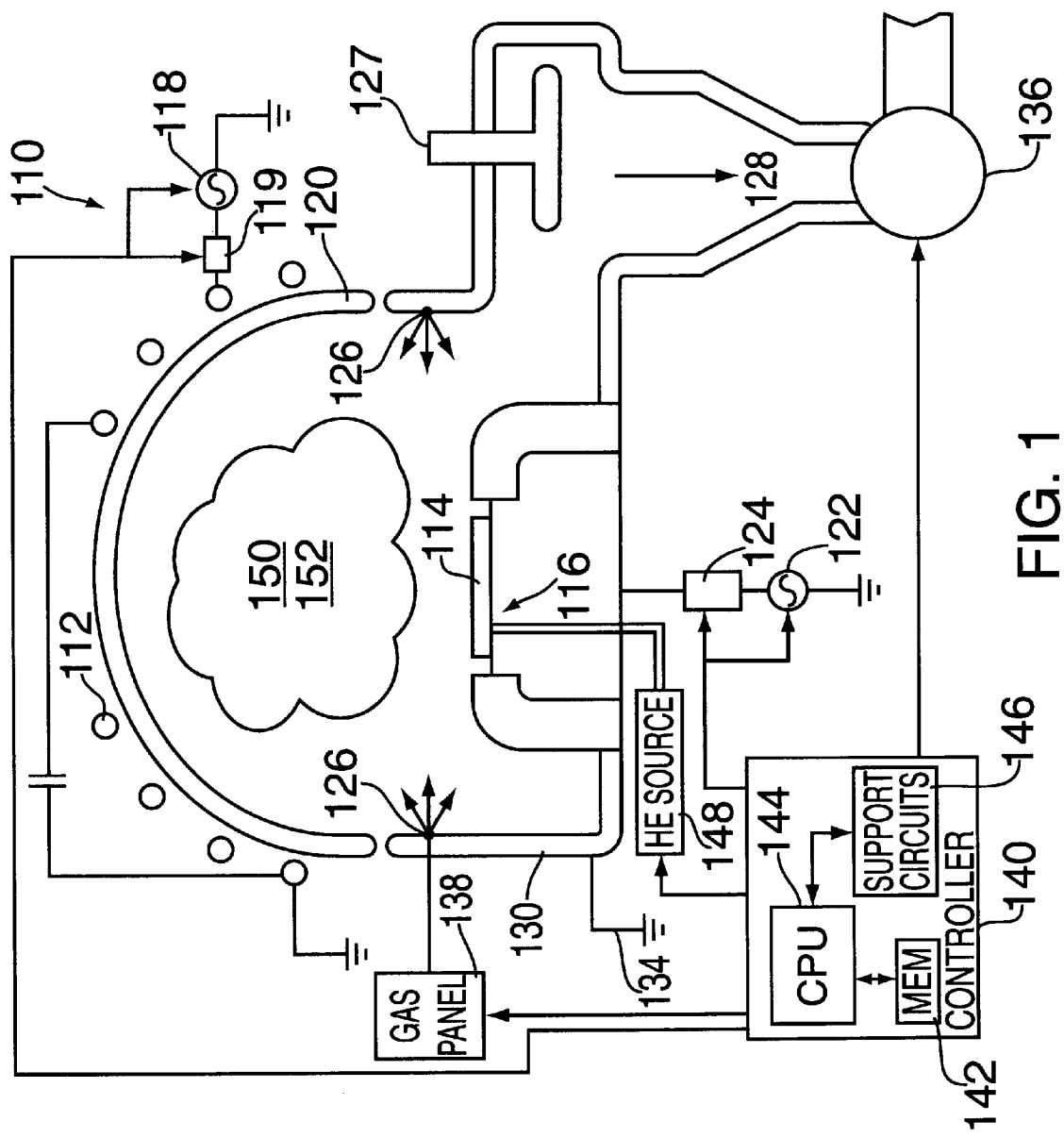
FIG. 1 is a schematic of a semiconductor process chamber in which an inventive method of FIG. 2 can be reduced to practice.

FIG. 1 depicts a schematic diagram of the DPS etch process chamber 110, that comprises at least one inductive coil antenna segment 112, positioned exterior to a dielectric, dome-shaped ceiling 120 (referred hereinafter as the dome 120). The antenna segment 112 is coupled to a radio-frequency (RF) source 118 that is generally capable of producing an RF signal having a tunable frequency of about 12.56 MHz. The RF source 118 is coupled to the antenna 112 through a matching network 119. The process chamber 110 also includes a substrate support pedestal (cathode) 116 that is coupled to a second RF source 122 that is capable of producing an RF signal having a frequency of approximately 13.56 MHz. The source 122 is coupled to the substrate support pedestal 116 though a matching network 124. The chamber 110 also contains a conductive chamber wall 130 that is coupled to an electrical ground 134. A controller 140 comprising a central processing unit (CPU) 144, a memory 142, and support circuits 146 for the CPU 144 is coupled to the various components of the DPS process chamber 110 to facilitate control of the etch process.

In operation, a semiconductor substrate 114 is placed on the substrate support pedestal 116 and gaseous components are supplied from a gas panel 138 to the process chamber 110 through entry ports 126 to form a reactant gas mixture 150. The reactant gas mixture 150 is ignited into a plasma 152 in the process chamber 110 by applying RF power from the RF sources 118 and 122 respectively to the antenna 112 and the substrate support pedestal 116. The pressure within the interior of the process chamber 110 is controlled using a throttle valve 127 situated between the chamber 110 and a vacuum pump 136. The temperature at the surface of the chamber wall 130 is controlled using liquid containing conduits (not shown) that are located within the walls 130 of the chamber 110. For example, the walls 130 can be maintained at about 65 degrees Celsius during processing.

The temperature of the substrate 114 is controlled by stabilizing the temperature of the support pedestal 116 and flowing helium gas from a source 148 to channels formed by the back of the substrate 114 and grooves (not shown) on the pedestal surface. The helium gas is used to facilitate heat transfer between the substrate 114 and the pedestal 116. For example, approximately 8 Torr of helium can be used. During the etch process, the substrate 114 is gradually heated by the plasma 152 to a steady state temperature. Using thermal control of both the dome 120 and the pedestal 116, the substrate 114 is maintained at a temperature of between about 20 to about 80 degrees Celsius, and preferably about 50 degrees Celsius.

To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk drive, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etch process 200 is generally stored in the memory 142, typically as a software routine 202. The software routine 202 may also be stored and/or executed by a second CPU (not shown) that is remotely located from the hardware being controlled by the CPU 144.

The etch process 200 can be illustratively reduced to practice on a film stack 400 contained on the wafer 114. The film stack 400 is depicted in FIG. 4 in a "pre-etch" state 410 and a "post-etch" state 430.

The film stack 400 as depicted in the "pre-etch" state 410 has a one or more substrate layers 412 below a tungsten layer 414. The tungsten layer 414 is typically patterned with a resist or hardmask 416 that leaves a portion 418 of the tungsten layer 414 exposed. A polysilicon layer 420 underlies at least the portion 418 of the tungsten layer 414. The "post-etch" state 430 is 10 provided to facilitate the discussion of the etch process 200 detailed below.

Figure 2:
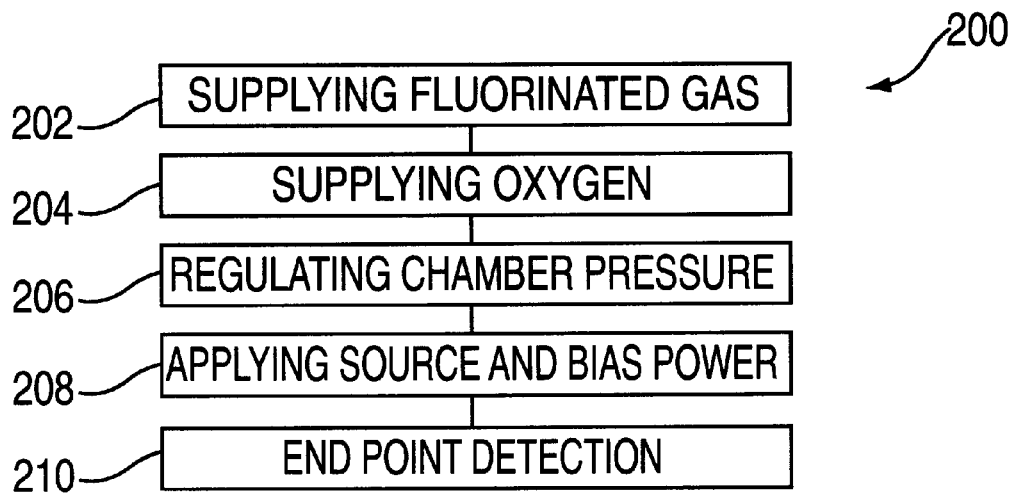
FIG. 2 is a block diagram depicting an inventive method of etching tungsten.
Figure 4:
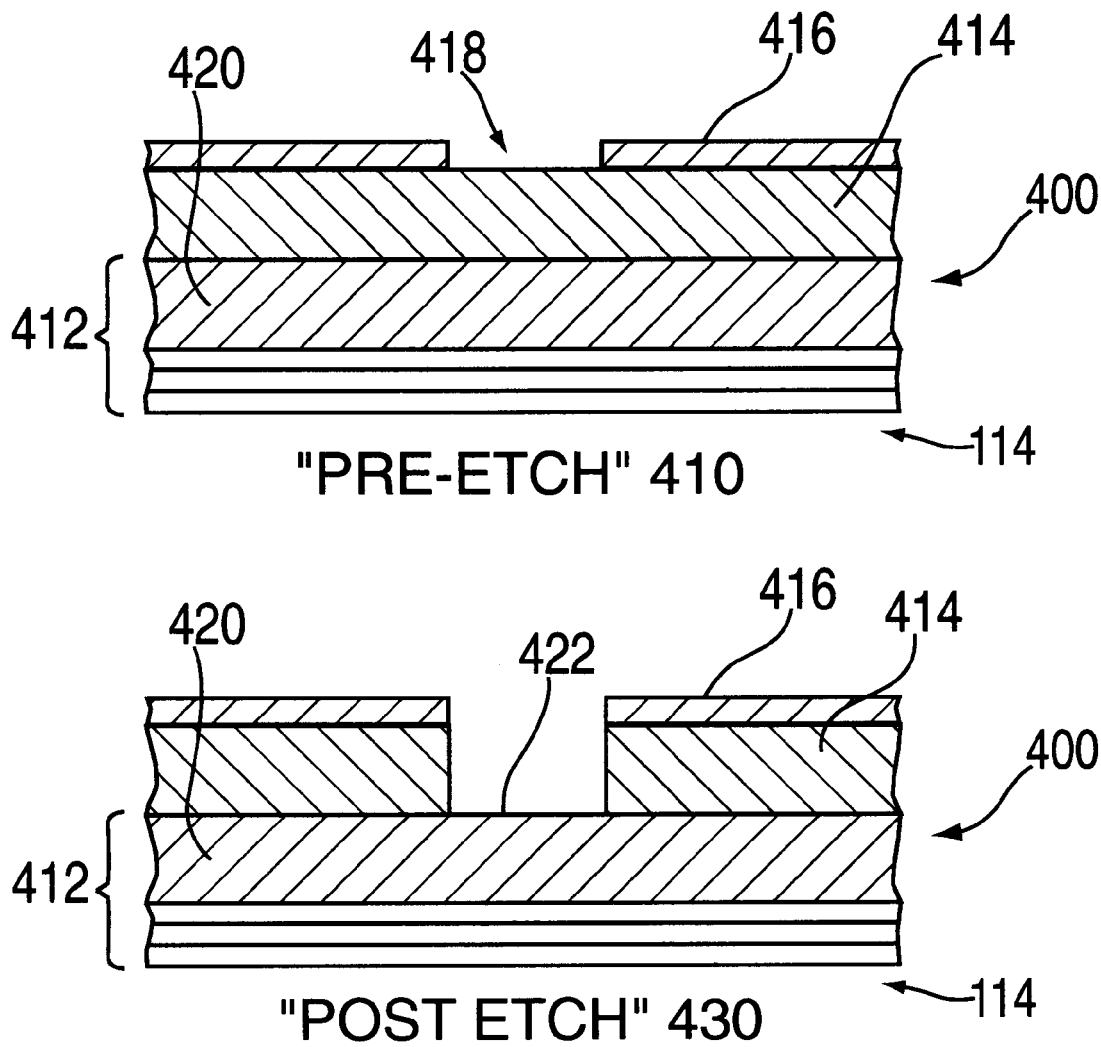

The software routine 202 that executes the etch process 200 is discussed with respect to FIG. 1, FIG. 2 and FIG. 4. The software routine 202 is executed after the wafer 114 is positioned on the pedestal 116. The software routine 202 when executed by the CPU 144, transforms the general purpose computer into a specific process computer (controller) 140 that controls the chamber operation such that the etch process 200 is performed. Although the process of the present invention is discussed as being implemented as a software routine, some or all of the method steps that are disclosed herein may be performed in hardware as well as by the software controller. As such, the invention may be implemented in software as executed upon a computer system, in hardware as an application specific integrated circuit or other type of hardware implementation, or a combination of software and hardware.

The film stack 400 in the "pre-etch" state 410 is 30 etched, for example, by supplying a reactant gas comprising between about 10 to about 200 sccm of a fluorinated gas (for example, $CF_4$, $NF_3$, $SF_6$, and other gases comprising fluorine) to the chamber 110 in step 202.

Next, between about 10 to about 200 sccm of oxygen is supplied to the chamber 110 and combined with the reactant gas in step 204. The chamber pressure is regulated to between about 0.5 to about 100 mTorr in step 206. Next in step 208, between about 100 to about 1000 Watts of RF power is applied to the antenna 112 and between about 10 to about 300 Watts of bias power is applied to the pedestal 116. The applied power ignites and sustains the plasma 152 and etches the tungsten layer 414. Of course, other sources of plasma ignition may also be used. The etch process 200 ends once an end point is reached in step 210.

The end point detection step 210 may be performed through a number of conventional methods. For example, the end point may be reached at the expiration of a timed etch period. Other end point detection methods include detecting an emission wavelength indicative of the etch reaching the underlying layer of material.

For example, end point detection may be performed by using of an end point detection system (e.g., an optical emission spectroscopy (OES) system) to detect when the etch process penetrates an overlying layer (for example, a tungsten layer) and begins etching an underlying layer (such as a polysilicon layer). The underlying layer, when etched, releases material into the chamber atmosphere that has a signature wavelength discernible by the end point detection system.

One skilled in the art will appreciate that selecting different endpoints may be necessary when using different materials comprising the underlying layer, and for tailoring the etch characteristics for a particular application. Other methods of end point detection are readily available and can be readily incorporated into the process discussed herein.

As seen by comparison of the "pre-etch" 410 and "post-etch" 430, the process 200 etches the tungsten layer 414 until the polysilicon layer 420 is reached. The oxygen in the reactant gas mixture 150 reacts with the now exposed polysilicon layer 420 and forms a surface oxide (or etch stop layer) 422 on the polysilicon layer 420. The surface oxide 422 has a selectivity in the range of 0.5 to 5 with respect to tungsten, and thus minimizes the amount of polysilicon 420 removed during the etch process 200.

Figure 3:
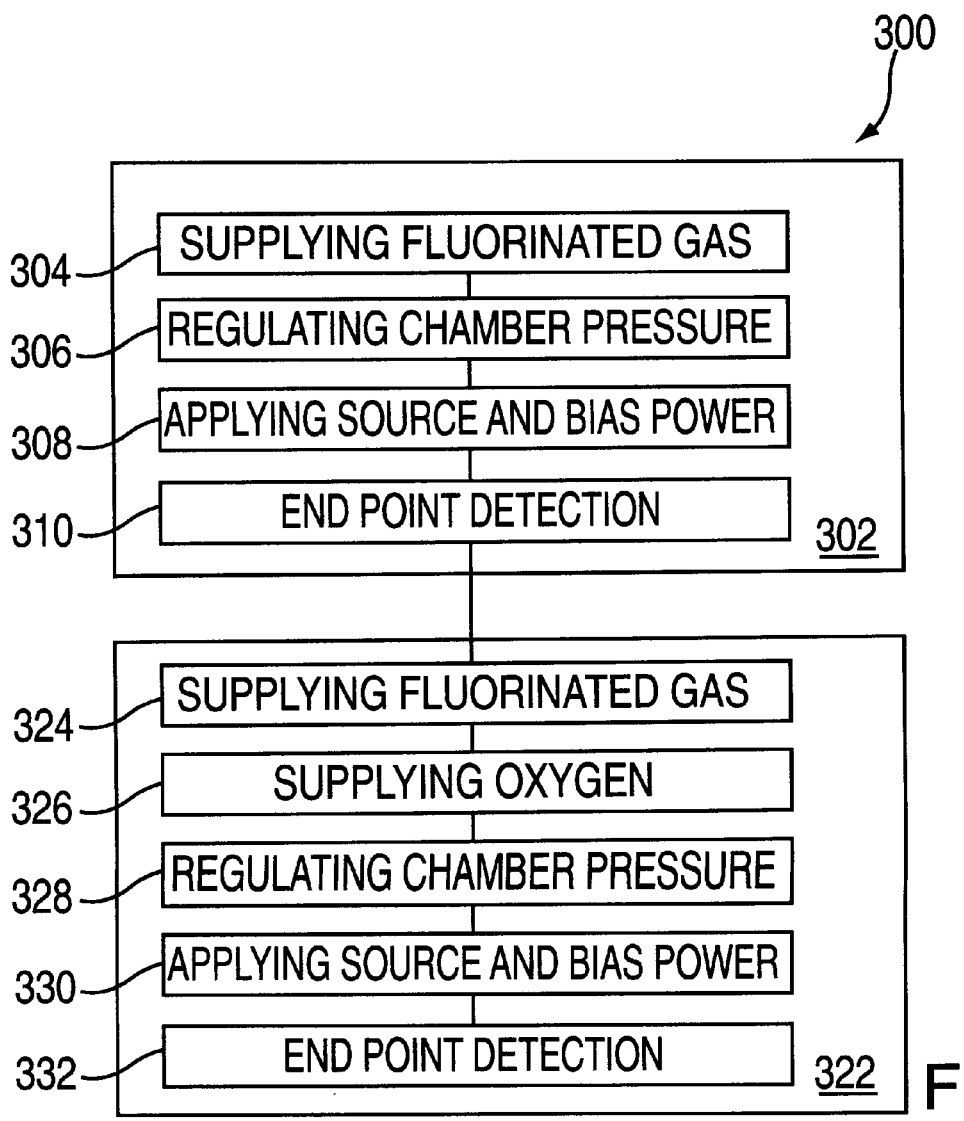
FIG. 3 is a block diagram depicting an alternate method of etching tungsten and, FIG. 4 depicts a schematic elevation of a wafer having a tungsten layer of the kind etched by the process of the present invention.

FIG. 3 depicts a block diagram of an alternate embodiment of the etch process 300. The etch process 300 comprises a main etch 302 followed by an over-etch 322.

The main etch 302 comprises supplying between about 10 to about 200 sccm of a first fluorinated gas (for example, $CF_4$, $NF_3$, $SF_6$, and other gases comprising fluorine) to the chamber 110 in step 304. The chamber pressure is regulated to between about 0.5 to about 100 mTorr in step 306. Next in step 308, between about 100 to about 1000 Watts of RF power is applied to the antenna 112 and between about 10 to about 300 Watts of bias power is applied to the pedestal 116. The applied power ignites and sustains the plasma 152 and etches the tungsten layer 414. Of course, other sources of plasma ignition may also be used. The main-etch process 302 ends once an end point is reached in step 310. Optionally, step 310 may stop the etch of the tungsten layer 414 before the polysilicon layer 420 is exposed.

The over-etch process 322 comprises supplying between about 10 to about 100 sccm of a second fluorinated gas (for example, $CF_4$, $NF_3$, $SF_6$, and other gases comprising fluorine) to the chamber 110 in step 324. Next, between about 10 to about 200 sccm of oxygen is supplied to the chamber 110 in step 326. The chamber pressure is regulated to between about 0.5 to about 100 mTorr in step 328. Next in step 330, between about 100 to about 1000 Watts of RF power is applied to the antenna 112 and between about 10 to about 300 Watts of bias power is applied to the pedestal 116. The applied power ignites and sustains the plasma 152 and etches the residual tungsten 414 not removed in the main-etch 302. Of course, other sources of plasma ignition may also be used. The etch process 300 ends once an end point is reached in step 322. Alternately, the oxygen added in step 326 may be applied after the plasma is struck in step 330 and the tungsten layer 414 is broken through.

In one exemplary embodiment, the etch process 300 is reduced to practice by:

performing a main-etch 302 comprising:
supplying a fluorinated gas mixture comprising about 50 sccm of $NF_3$, about 50 sccm of $Cl_2$, and about 10 sccm of $CF_4$ (step 304);
regulating the chamber pressure to about 4 mTorr (step 306);
applying source and bias power of about 300 and about 110 Watts, respectively (step 308);
reaching an etch endpoint by detecting a wavelength of 2880 Å(step 310).

The main-etch 302 is followed by an over-etch 322 comprising the steps of:
supplying a fluorinated gas mixture comprising about 20 sccm of $NF_3$ and about 50 sccm of $NF_3$ (step 324);
supplying about 50 sccm of $O_2$ (step 326);
regulating the chamber pressure to about 4 mTorr (step 328);
applying source and bias power of about 400 and about 150 Watts, respectively (step 330);
reaching an etch endpoint by the expiration of a 7 second timed etch (step 332).

Alternately, the main etch process 302 and the over-etch process 322 may be condensed by supplying the second fluorinated gas and oxygen to the chamber simultaneously with the termination of the flow of the first fluorinated gas after the end point is reached in step 310. The bias power is removed and the source power is changed to the settings disclosed in step 300 (i.e., about 400 Watts source and about 150 Watts bias power). At this point, the over-etch is performed until the end point is reached (step 332).

Although the present invention is disclosed illustratively using a DPS process chamber, the invention may be practiced in other etching equipment wherein the processing parameters may be adjusted to achieve acceptable etch characteristics by those skilled in the arts by utilizing the teachings disclosed herein without departing from the spirit of the invention.

What is claimed is:

1. Apparatus for etching a substrate comprising:
a processing chamber having a gas inlet; and
a gas panel coupled to said gas inlet for supplying fluorinated gas at a rate of about 10 to about 200 sccm and oxygen at a rate of about 10 to about 200 sccm, said fluorinated gas and oxygen forming a plasma capable of etching a tungsten layer disposed on said substrate, and wherein said oxygen forms an oxide etch stop layer atop a polysilicon layer underlying said tungsten layer.

2. The apparatus of claim 1 wherein the fluorinated gas is selected from the group consisting of $CF_4$, $NF_3$ and $SF_6$.

3. The apparatus of claim 1 further comprising:
a first power source applying inductive source power of about 100 to about 1000 Watts to an inductively coupled antenna disposed about said chamber; and
a second power source applying bias power of about 10 to about 300 Watts to a pedestal having an embedded electrode disposed in said chamber.

4. The apparatus of claim 1 wherein the fluorinated gas and the oxygen are regulated to a chamber pressure of between about 0.5 and 100 mTorr.

5. A method for etching a substrate comprising a tungsten layer overlying polysilicon, said method comprising the steps of:
supplying a reactant gas comprising a fluorinated gas to a processing chamber;
supplying oxygen to said processing chamber;
forming a plasma in said chamber from said reactant gas.

6. The method of claim 5 wherein the fluorinated gas is selected from the group consisting of $CF_4$, $NF_3$ and $SF_6$.

7. The method of claim 5 where said fluorinated gas is supplied at a flow rate of about 10 to about 200 sccm.

8. The method of claim 5 wherein said oxygen is supplied at a flow rate of about 10 to about 200 sccm.

9. The method of claim 5 further comprising the step of reaching an endpoint at or near the breakthrough of said tungsten layer wherein said oxygen supplying step occurs after said endpoint is reached.

10. The method of claim 5 further comprising the steps of:
applying inductive source power of about 100 to about 1000 Watts to an inductively coupled antenna disposed about said processing chamber; and,
applying bias power of about 10 to about 300 Watts to a pedestal disposed within said processing chamber.

11. The method of claim 5 wherein the steps of supplying the fluorinated gas and oxygen further comprise the step of:
regulating said chamber pressure between about 0.5 to about 100 mTorr.

12. The method of claim 5 further comprising the step of:
performing a main-etch to substantially remove said tungsten layer.

13. The method of claim 12 wherein said main-etch further comprises:
supplying a fluorinated gas to a processing chamber at a flow rate of about 10 to about 200 sccm, said fluorinated gas selected from the group consisting of $CF_4$, $NF_3$ and $SF_6$;

regulating said chamber pressure between about 0.5 to about 100 mTorr;

applying inductive source power of about 10 to about 1000 Watts to an inductively coupled antenna disposed about said processing chamber;

applying bias power of about 10 to about 300 Watts to a pedestal disposed within said processing chamber; and, forming a plasma in said chamber from said fluorinated gas.

14. The method of claim 12 wherein said fluorinated gas is supplied at a flow rate of about 10 to about 200 sccm.

15. The method of claim 12 wherein the steps of supplying the fluorinated gas and oxygen further comprise the step of:

regulating said chamber pressure between about 0.5 to about 100 mTorr.

16. The method of claim 12 further comprising the steps of:

applying inductive source power of about 100 to about 1000 Watts to an inductively coupled antenna disposed about said processing chamber; and, applying bias power of about 10 to about 300 Watts to a pedestal disposed within said processing chamber.

17. A method for etching a substrate comprising a tungsten layer overlying polysilicon, said method comprising the steps of:

performing a first etch process comprising the steps of:

supplying a first fluorinated gas to a processing chamber at a flow rate of about 10 to about 200 sccm, said first fluorinated gas selected from the group consisting of $CF_4$, $NF_3$ and $SF_6$;

regulating said processing chamber pressure between about 0.5 to about 100 mTorr;

applying inductive source power of about 100 to about 1000 Watts to an inductively coupled antenna disposed about said processing chamber;

applying bias power of about 10 to about 300 Watts to a pedestal disposed within said processing chamber;

forming a first plasma in said chamber from said first fluorinated gas; and, performing a second etch comprising the steps of:

supplying a second fluorinated gas to said processing chamber at a flow rate of about 10 to about 200 sccm, said second fluorinated gas selected from the group consisting of $CF_4$, $NF_3$ and $SF_6$;

supplying oxygen to said processing chamber at a flow rate of about 10 to about 200 sccm;

regulating said processing chamber pressure between about 0.5 to about 100 mTorr;

applying inductive source power of about 100 to about 1000 Watts to said inductively coupled antenna;

applying bias power of about 10 to about 300 Watts to said pedestal; and, forming a second plasma in said chamber from said fluorinated gas and oxygen.

18. A computer readable medium containing a software routine that, when execute by a processor, cause the semiconductor wafer processing system to perform the steps of:

supplying a reactant gas comprising a fluorinated gas to a processing chamber;

supplying oxygen to said processing chamber;

forming a plasma in said chamber from said reactant gas.

19. The computer readable medium of claim 18 further comprising the step of reaching an endpoint at or near the breakthrough of said tungsten layer wherein said oxygen supplying step occurs after said endpoint is reached.

20. The computer readable medium of claim 18 wherein the fluorinated gas is selected from the group consisting of $CF_4$, $NF_3$ and $SF_6$.

21. The computer readable medium of claim 18 where said fluorinated gas is supplied at a flow rate of about 10 to about 200 sccm.

22. The computer readable medium of claim 18 further comprising the steps of:

applying inductive source power of about 100 to about 1000 Watts to an inductively coupled antenna disposed about said processing chamber; and, applying bias power of about 10 to about 300 Watts to a pedestal disposed within said processing chamber.

23. The computer readable medium of claim 18 wherein the steps of supplying the fluorinated gas and oxygen further comprise the step of:

regulating said chamber pressure between about 0.5 to about 100 mTorr.

24. The computer readable medium of claim 18 further comprising the step of:

performing a main-etch to substantially remove said tungsten layer.

25. The computer readable medium of claim 24 wherein said main-etch further comprises:

supplying a fluorinated gas to a processing chamber at a flow rate of about 10 to about 200 sccm, said fluorinated gas selected from the group consisting of $CF_4$, $NF_3$ and $SF_6$;

regulating said chamber pressure between about 0.5 to about 100 mTorr;

applying inductive source power of about 100 to about 1000 Watts to an inductively coupled antenna disposed about said processing chamber;

applying bias power of about 10 to about 300 Watts to a pedestal disposed within said processing chamber; and, forming a plasma in said chamber from said fluorinated gas.

26. The computer readable medium of claim 24 wherein said fluorinated gas is supplied at a flow rate of about 10 to about 200 sccm.

27. The computer readable medium of claim 18 wherein said oxygen is supplied at a flow rate of about 10 to about 200 sccm.

28. The computer readable medium of claim 24 wherein the steps of supplying the fluorinated gas and oxygen further comprise the step of:

regulating said chamber pressure between about 0.5 to about 100 mTorr.

29. The computer readable medium of claim 24 further comprising the steps of:

applying inductive source power of about 100 to about 1000 Watts to an inductively coupled antenna disposed about said processing chamber; and, applying bias power of about 10 to about 300 Watts to a pedestal disposed within said processing chamber.

* * * * *

UNITED STATES PATENT AND TRADEMARK OFFICE
CERTIFICATE OF CORRECTION

PATENT NO. : 6,277,763 B1
DATED : August 21, 2001
INVENTOR(S) : Kugimiya et al.

It is certified that error appears in the above-identified patent and that said Letters Patent is hereby corrected as shown below:

<u>Column 4,</u>
Line 5, please delete "10".
Line 23, please delete "30".

Signed and Sealed this

Thirtieth Day of April, 2002

Attest:

Attesting Officer

JAMES E. ROGAN
*Director of the United States Patent and Trademark Office*